United States Patent
Haba et al.

(10) Patent No.: US 9,917,042 B2
(45) Date of Patent: Mar. 13, 2018

(54) 2.5D MICROELECTRONIC ASSEMBLY AND METHOD WITH CIRCUIT STRUCTURE FORMED ON CARRIER

(71) Applicant: Invensas Corporation, San Jose, CA (US)

(72) Inventors: Belgacem Haba, Saratoga, CA (US); Sean Moran, Burlingame, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/147,099

(22) Filed: May 5, 2016

(65) Prior Publication Data

US 2016/0329300 A1    Nov. 10, 2016

Related U.S. Application Data

(60) Provisional application No. 62/159,136, filed on May 8, 2015.

(51) Int. Cl.
  *H01L 23/498*     (2006.01)
  *H01L 21/48*      (2006.01)
  (Continued)

(52) U.S. Cl.
  CPC .......... *H01L 23/498* (2013.01); *H01L 21/486* (2013.01); *H01L 21/4846* (2013.01);
  (Continued)

(58) Field of Classification Search
  CPC ..................... H01L 25/0652; H01L 25/0657
  See application file for complete search history.

(56) References Cited

U.S. PATENT DOCUMENTS 5,847,936 A    12/1998  Forehand et al.
6,064,114 A *  5/2000   Higgins, III ........ H01L 23/3114
                                              257/698
(Continued)

FOREIGN PATENT DOCUMENTS

DE    19904258 A1    12/1999
WO    2013172814 A1  11/2013
WO    2014066153 A1   5/2014

OTHER PUBLICATIONS

U.S. Appl. No. 62/159,136, filed May 8, 2015.
(Continued)

*Primary Examiner* — Anthony Ho
*Assistant Examiner* — Antonio Crite
(74) *Attorney, Agent, or Firm* — Lerner, David, Littenberg, Krumholz & Mentlik, LLP

(57) ABSTRACT

A dielectric element has a plurality of contacts at a first surface and a plurality of first traces coupled thereto which extend in directions parallel to the first surface. A circuit structure made of a plurality of dielectric layers and electrically conductive features thereon includes a plurality of bumps at a first surface which face the contacts of the dielectric element and are joined thereto. Circuit structure contacts at a second surface opposite the first surface are electrically coupled with the bumps through second traces on the circuit structure, the circuit structure contacts configured for connection with a plurality of element contacts of each of a plurality of microelectronic elements, wherein the microelectronic elements can be assembled therewith such that element contacts thereof face and are joined with the circuit structure contacts.

29 Claims, 13 Drawing Sheets

(51) Int. Cl.

| | | |
|---|---|---|
| H01L 23/00 | (2006.01) | |
| H01L 21/78 | (2006.01) | |
| H01L 25/10 | (2006.01) | |
| H01L 21/56 | (2006.01) | |
| H01L 21/683 | (2006.01) | |
| H01L 23/31 | (2006.01) | |
| H01L 23/367 | (2006.01) | |
| H01L 25/065 | (2006.01) | |
| H01L 25/16 | (2006.01) | |
| H01L 25/18 | (2006.01) | |
| H01L 23/04 | (2006.01) | |
| H01L 25/00 | (2006.01) | |

(52) U.S. Cl.
CPC .......... *H01L 21/4853* (2013.01); *H01L 21/56* (2013.01); *H01L 21/563* (2013.01); *H01L 21/6835* (2013.01); *H01L 21/78* (2013.01); *H01L 23/04* (2013.01); *H01L 23/3121* (2013.01); *H01L 23/3135* (2013.01); *H01L 23/3142* (2013.01); *H01L 23/3675* (2013.01); *H01L 23/49811* (2013.01); *H01L 23/49816* (2013.01); *H01L 23/49822* (2013.01); *H01L 23/49827* (2013.01); *H01L 23/49838* (2013.01); *H01L 24/17* (2013.01); *H01L 24/81* (2013.01); *H01L 25/0652* (2013.01); *H01L 25/105* (2013.01); *H01L 25/16* (2013.01); *H01L 25/18* (2013.01); *H01L 25/0655* (2013.01); *H01L 25/50* (2013.01); *H01L 2221/68345* (2013.01); *H01L 2221/68359* (2013.01); *H01L 2221/68381* (2013.01); *H01L 2224/16113* (2013.01); *H01L 2224/16227* (2013.01); *H01L 2224/32225* (2013.01); *H01L 2224/73204* (2013.01); *H01L 2224/81192* (2013.01); *H01L 2224/97* (2013.01); *H01L 2225/0652* (2013.01); *H01L 2225/06517* (2013.01); *H01L 2225/06548* (2013.01); *H01L 2225/06572* (2013.01); *H01L 2225/06589* (2013.01); *H01L 2225/1058* (2013.01); *H01L 2924/1427* (2013.01); *H01L 2924/15192* (2013.01); *H01L 2924/15311* (2013.01); *H01L 2924/19041* (2013.01); *H01L 2924/19102* (2013.01)

(56) References Cited

U.S. PATENT DOCUMENTS

| | | | | |
|---|---|---|---|---|
| 6,150,724 | A | * | 11/2000 | Wenzel ............... H01L 25/0657 257/724 |
| 6,285,079 | B1 | | 9/2001 | Kunikiyo |
| 6,391,220 | B1 | | 5/2002 | Zhang et al. |
| 6,610,934 | B2 | | 8/2003 | Yamaguchi et al. |
| 6,711,813 | B1 | | 3/2004 | Beyne et al. |
| 6,747,350 | B1 | | 6/2004 | Lin et al. |
| 6,789,034 | B2 | | 9/2004 | Freed |
| 6,879,034 | B1 | | 4/2005 | Yang et al. |
| 7,084,487 | B1 | | 8/2006 | Conn |
| 7,193,311 | B2 | | 3/2007 | Ogawa et al. |
| 7,235,477 | B2 | | 6/2007 | Ogawa |
| 7,791,199 | B2 | | 9/2010 | Grinman et al. |
| 7,882,628 | B2 | | 2/2011 | Muthukumar et al. |
| 7,902,661 | B2 | | 3/2011 | Smeys et al. |
| 8,105,875 | B1 | * | 1/2012 | Hu ........................ H01L 21/486 257/E21.499 |
| 8,125,065 | B2 | | 2/2012 | Lee |
| 8,198,724 | B1 | | 6/2012 | Wu et al. |
| 8,486,758 | B2 | | 7/2013 | Oganesian et al. |
| 8,952,516 | B2 | | 2/2015 | Zohni et al. |
| 9,024,205 | B2 | | 5/2015 | Uzoh |
| 9,257,396 | B2 | | 2/2016 | Uzoh |
| 9,437,536 | B1 | | 9/2016 | Wang et al. |
| 9,570,410 | B1 | * | 2/2017 | Chang ..................... H01L 24/03 |
| 2002/0045293 | A1 | * | 4/2002 | Tsunoi ................. G01R 1/0408 438/108 |
| 2002/0079591 | A1 | | 6/2002 | Sakiyama et al. |
| 2004/0080036 | A1 | | 4/2004 | Chang et al. |
| 2004/0264837 | A1 | * | 12/2004 | Ogawa ..................... G02B 6/42 385/14 |
| 2005/0067680 | A1 | | 3/2005 | Boon et al. |
| 2005/0260794 | A1 | | 11/2005 | Lo et al. |
| 2006/0033210 | A1 | | 2/2006 | Chauhan et al. |
| 2011/0126408 | A1 | | 6/2011 | Antesberger et al. |
| 2011/0127664 | A1 | | 6/2011 | Antesberger et al. |
| 2011/0133342 | A1 | | 6/2011 | Arai |
| 2012/0139094 | A1 | | 6/2012 | Haba et al. |
| 2012/0319295 | A1 | | 12/2012 | Chi et al. |
| 2013/0075889 | A1 | * | 3/2013 | Pagaila ................ H01L 23/552 257/713 |
| 2013/0083583 | A1 | | 4/2013 | Crisp et al. |
| 2013/0093087 | A1 | | 4/2013 | Chau et al. |
| 2013/0127054 | A1 | | 5/2013 | Muthukumar et al. |
| 2013/0264704 | A1 | | 10/2013 | Pendse |
| 2013/0313012 | A1 | | 11/2013 | Yang et al. |
| 2014/0070423 | A1 | * | 3/2014 | Woychik ............. H01L 25/0652 257/774 |
| 2014/0159247 | A1 | * | 6/2014 | Lyne ..................... H01L 25/065 257/774 |
| 2014/0217617 | A1 | | 8/2014 | Haba et al. |
| 2014/0231984 | A1 | | 8/2014 | Chen |
| 2014/0240938 | A1 | | 8/2014 | Newman et al. |
| 2014/0312490 | A1 | | 10/2014 | Yang et al. |
| 2015/0255361 | A1 | * | 9/2015 | Lee ..................... H01L 23/3135 257/738 |
| 2015/0259194 | A1 | * | 9/2015 | Lin ........................ B81B 7/007 257/773 |
| 2015/0327367 | A1 | * | 11/2015 | Shen ..................... H05K 1/111 361/767 |
| 2015/0348940 | A1 | * | 12/2015 | Woychik ............. H01L 25/0657 257/774 |
| 2016/0190098 | A1 | * | 6/2016 | Chen ..................... H01L 23/3128 257/774 |
| 2016/0300817 | A1 | | 10/2016 | Do et al. |
| 2016/0329267 | A1 | | 11/2016 | Huang et al. |

OTHER PUBLICATIONS

International Search Report and Written Opinion for Application No. PCT/US2014/018057 dated May 8, 2014.

International Search Report and Written Opinion for Application No. PCT/US2014/067496 dated Feb. 18, 2015.

International Search Report and Written Opinion for Application No. PCT/US2016/031207 dated Jul. 21, 2016.

International Search Report and Written Opinion for Application No. PCT/US2016/031259 dated Jul. 21, 2016.

* cited by examiner

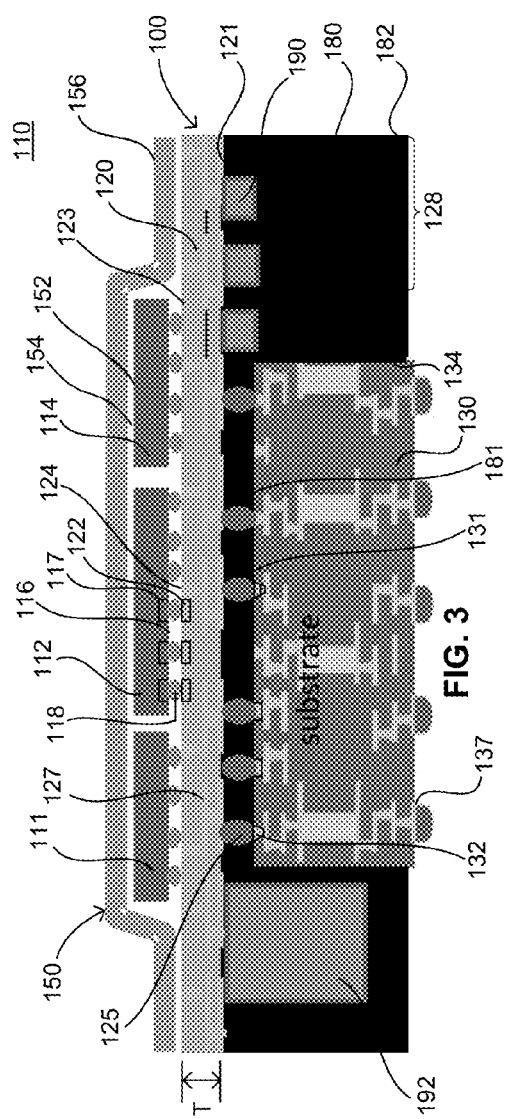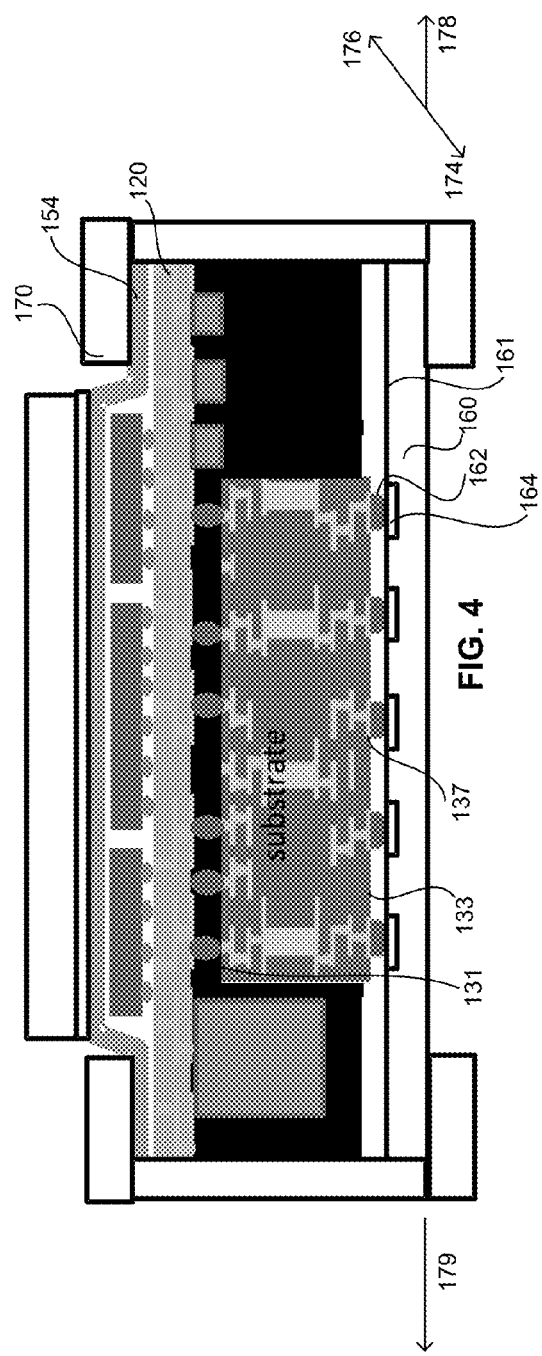
FIG. 3
FIG. 4

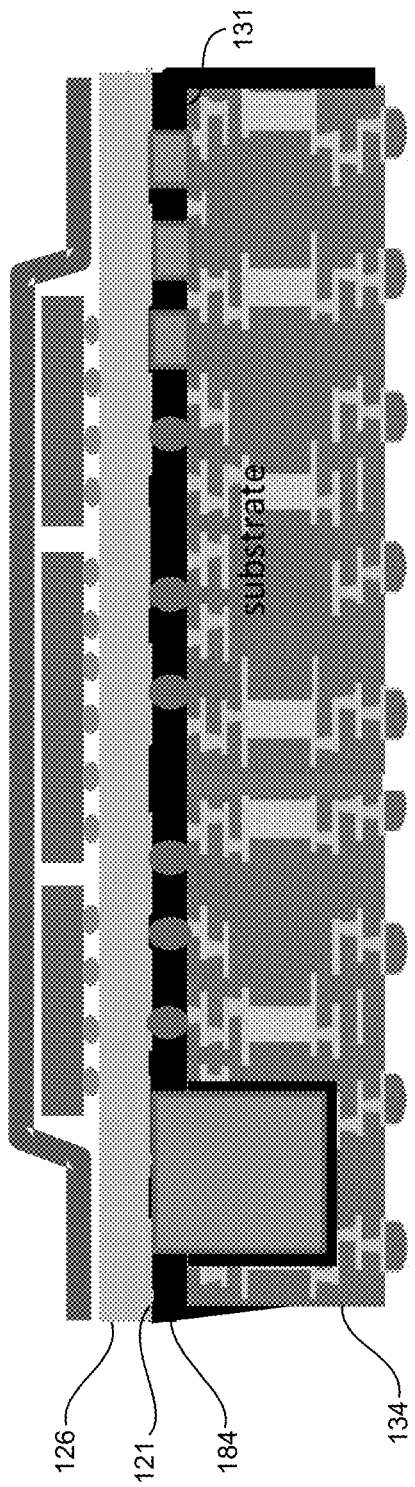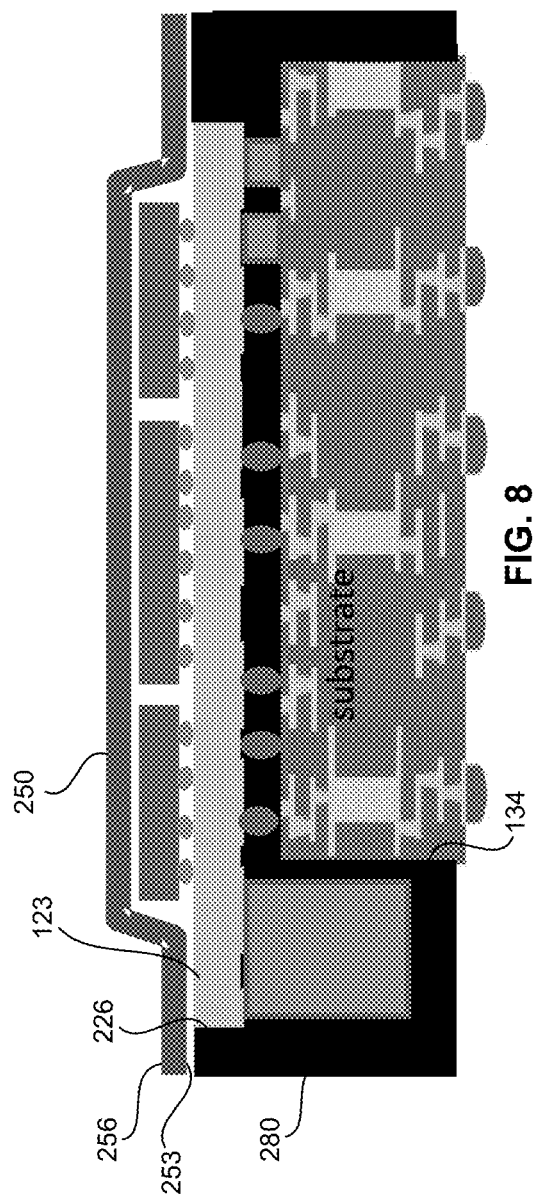

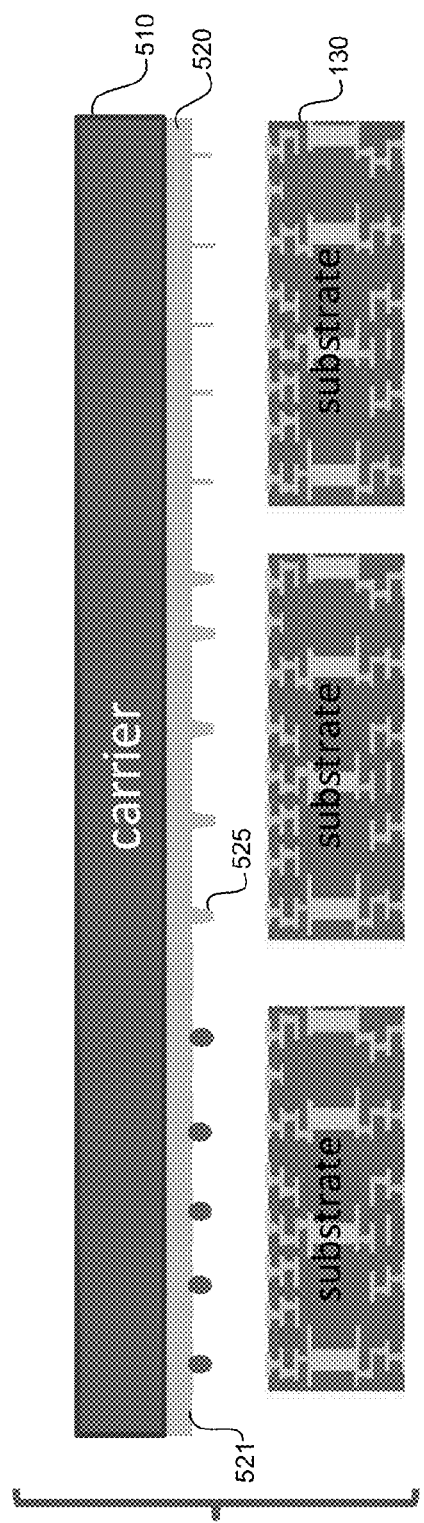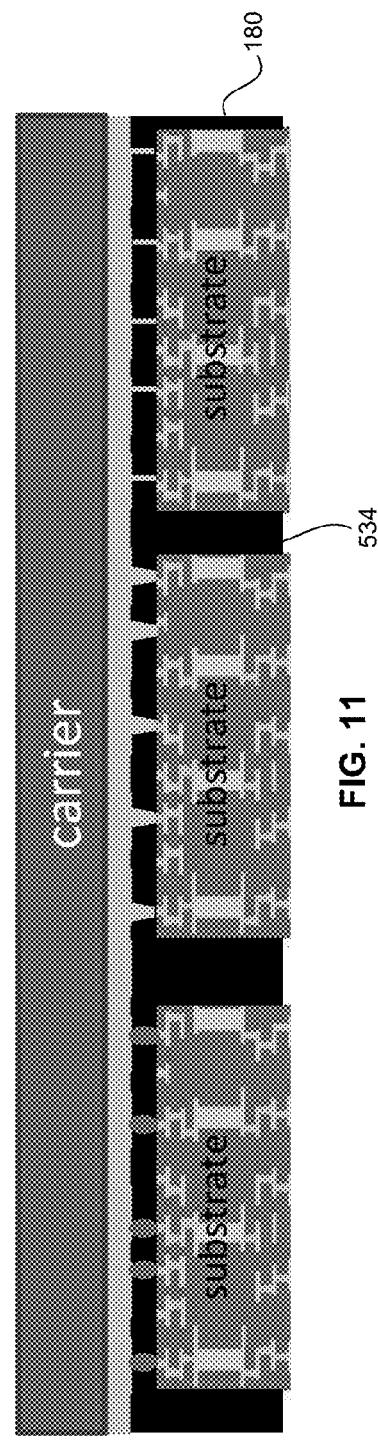

2.5D MICROELECTRONIC ASSEMBLY AND METHOD WITH CIRCUIT STRUCTURE FORMED ON CARRIER

CROSS-REFERENCE TO RELATED APPLICATION

This application claims the benefit of the filing date of U.S. Provisional Application No. 62/159,136 filed May 8, 2015.

BACKGROUND OF THE INVENTION

Technical Field

The subject matter of the present application relates to microelectronic packaging and elements thereof to more specifically to an assembly for electrically interconnecting and packaging a plurality of microelectronic elements in a common package.

Description of the Related Art

Multi-chip packages which incorporate silicon interposers can be used to provide high speed, high bandwidth or a high degree of parallel interconnections between multiple microelectronic elements arranged side by side above a surface of a common interposer. Silicon interposers are typically formed from a relatively thick wafer in which wiring patterns and contacts are fabricated in a thin layer of the silicon wafer and above the thin layer, after which the bulk of the wafer is ground down or otherwise discarded. As silicon wafers are almost exclusively processed using semiconductor processing equipment in clean rooms, such processing and the discarding of the unneeded bulk wafer can make silicon interposers more expensive and more difficult to fabricate than other types of circuit structures.

In addition, the horizontal area of such multi-chip package can be large, and may constrain further miniaturization of a system such as smart phone, tablet, phablet or other handheld device or personal computer in which the multi-chip package is incorporated.

For example, in an example of a multi-chip package 10 seen in FIG. 1, microelectronic elements 11, 12 and 14 overlie and are electrically interconnected with one another by silicon interposer 20 and are electrically interconnected with a substrate 30 through the silicon interposer 20. Electrical coupling of the silicon interposer with an underlying substrate 30 can be provided through electrically conductive features such as vias which formed typically by drilling through multiple levels of contacts and depositing a metal therein such as by electroless or electrolytic plating or, alternatively, physical or chemical vapor deposition processes.

Auxiliary components such as passive components 40, e.g., decoupling capacitors, and/or resistors can be electrically coupled to the substrate 30 outside the horizontal area of the silicon interposer 20, that is, beyond edges 22 of the silicon interposer. Such components 40 can cooperate with the microelectronic elements 11, 12, 14 of the assembly to provide improved function. As further seen in FIG. 1, a thermally conductive element, i.e., a heat spreader 50, can be thermally coupled to rear surfaces 52 of the microelectronic elements. The heat spreader may also serve as a protective cover for the assembly and the components 40 therein.

FIG. 2 further illustrates electrical and mechanical interconnection of the multi-chip package 10 within a system such as described above. For example, the multi-chip package 30 can be mounted on and electrically connected with a circuit panel 60 through solder balls 62. Clamps 70 may engage the package 10 at a foot portion 54 of the heat spreader and an outwardly facing surface 62 of the circuit panel 60. A further component 80 such as a housing, heat sink, cold plate, cooling duct, or fan can be thermally coupled to a surface 56 of the heat spreader which faces away from the microelectronic elements.

Further improvements in the structure and fabrication of the multi-chip package 10, as well as the horizontal area occupied thereby, would be desirable.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/Os." These I/Os must be interconnected with the I/Os of other chips. The components which form the interconnections should not greatly increase the size of the assembly. Similar needs arise in other applications as, for example, in data servers such as those used in internet search engines where increased performance and size reduction are needed.

Semiconductor chips containing memory storage arrays, particularly dynamic random access memory chips (DRAMs) and flash memory chips are commonly packaged in single- or multiple-chip packages and assemblies. Each package has many electrical connections for carrying signals, power and ground between terminals and the chips therein. The electrical connections can include different kinds of conductors such as horizontal conductors, e.g., traces, beam leads, etc., which extend in a horizontal direction relative to a contact-bearing surface of a chip, vertical conductors such as vias, which extend in a vertical direction relative to the surface of the chip, and wire bonds which extend in both horizontal and vertical directions relative to the surface of the chip.

As manufacturers of smartphones, tablets and other devices constantly seek increased performance and greater circuit density the trend for these devices is to provide ever greater functional capabilities in an amount of space on a circuit panel that may stay the same or decrease over time. In light of the foregoing, certain improvements can be made in the structure of microelectronic packages and assemblies which comprise a microelectronic package having a memory controller function, or "controller package" as further defined herein. Such improvements may help reduce an amount of space of a circuit panel, e.g., motherboard occupied by the controller and memory packages when such controller and memory packages are mounted in close proximity to one another at non-overlapping areas of the circuit panel.

BRIEF DESCRIPTION OF THE DRAWINGS

FIG. 3 depicts a multi-chip package in accordance with an embodiment disclosed herein.

FIG. 4 depicts a multi-chip package in accordance with an embodiment disclosed herein, as further electrically or mechanically interconnected with additional components.

FIG. 7A depicts a multi-chip package in accordance with a variation of the embodiment seen in FIG. 3.

FIG. 8 depicts a multi-chip package in accordance with a variation of the embodiment seen in FIG. 3.

FIG. 10 depicts a stage in a method of making a multi-chip package in accordance with an embodiment disclosed herein.

FIG. 11 depicts a further stage in a method of making a multi-chip package in accordance with an embodiment disclosed herein.

DETAILED DESCRIPTION

Figure 1:
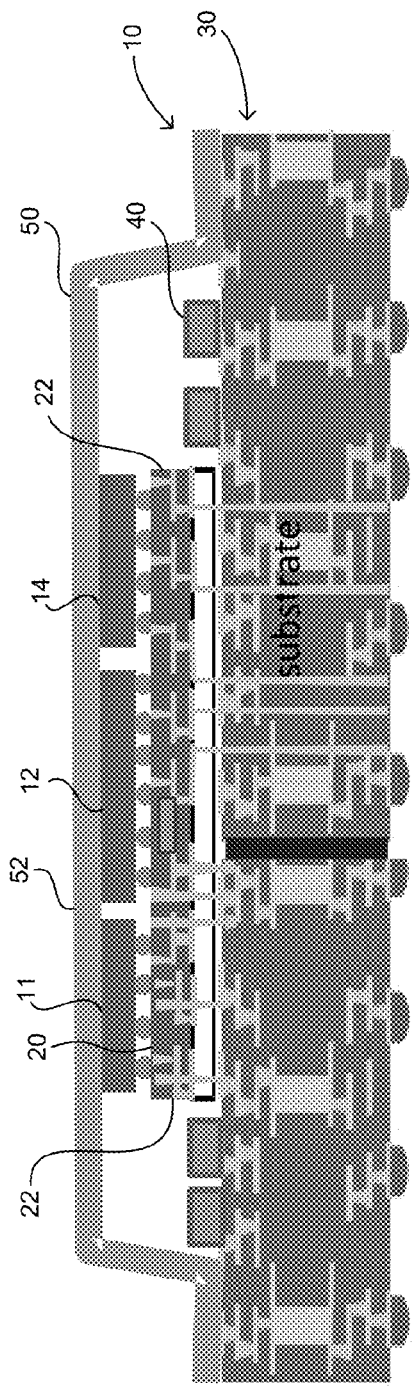
FIG. 1 depicts a multi-chip package in accordance with the prior art.

In accordance with an embodiment disclosed herein, a microelectronic assembly can include a dielectric element having a plurality of contacts at a first surface thereof and a plurality of first electrically conductive traces coupled with the contacts, the first traces extending in directions parallel to the first surface. The microelectronic assembly may include a circuit structure made of a plurality of dielectric layers and electrically conductive features thereon. In one example, the circuit structure may have a maximum thickness of less than 10 micrometers in a direction normal to the first surface of the circuit structure. The electrically conductive features may comprise a plurality of bumps at a first surface of the circuit structure facing the contacts of the dielectric element and joined thereto, a plurality of circuit structure contacts at a second surface opposite the first surface. The circuit structure may further include a plurality of second traces, wherein the bumps and the circuit structure contacts are electrically coupled by the second traces.

The microelectronic assembly may further include a plurality of microelectronic elements, e.g., elements having a plurality of active devices thereon electrically coupled together in an integrated circuit. Each microelectronic element may have a front surface, edge surfaces extending away from the front surface, and element contacts at the front surface. The element contacts may be juxtaposed with and electrically coupled with the circuit structure contacts. An insulating encapsulation may overlie at least the edge surfaces of the microelectronic elements.

In a variation of such embodiment, an insulating encapsulation overlying at least the edge surfaces of the microelectronic elements.

In a particular example, the microelectronic assembly may comprise a thermal conductor, which can be thermally coupled and attached to surfaces of the microelectronic elements which face away from the circuit structure. In one example, the thermal conductor may have a foot portion in close proximity to the circuit structure at locations beyond edge surfaces of the microelectronic elements. In other examples, a surface of the thermal conductor which faces toward the circuit structure defines a plane that extends beyond above a surface of an encapsulation that extends laterally beyond outer edges of the microelectronic elements towards peripheral edges of the microelectronic assembly.

In accordance with an embodiment disclosed herein, a method of making an assembly can include forming a subassembly on a carrier, the subassembly including a circuit structure having microelectronic elements attached thereto with an encapsulation contacting edges of the microelectronic elements, and thereafter, separating the subassembly from the carrier and assembling the subassembly with a dielectric element through a plurality of interconnects extending between the facing surfaces and electrically conductive features of the circuit structure and dielectric element.

The forming of the subassembly may comprise forming a circuit structure mechanically coupled to a surface of a carrier, the forming including forming a first dielectric layer mechanically coupled to the carrier, forming first conductive elements adjacent the carrier and a plurality of traces supported by the first dielectric layer, at least some of the traces having first widths less than two micrometers, and forming second contacts at a second surface of the second dielectric layer opposite from the first surface of the first dielectric layer; and juxtaposing the second contacts of the circuit structure with corresponding element contacts at front surfaces of a plurality of microelectronic elements, and then joining the second contacts with the element contacts. A dielectric encapsulation may be formed which overlies and extends between edge surfaces of laterally adjacent microelectronic elements on the circuit structure.

A microelectronic assembly 100 in accordance with an embodiment of the invention is illustrated in FIG. 3, wherein FIG. 4 depicts the assembly as connected in a surface mount arrangement with a circuit panel 160 to which other components are typically also connected. The assembly 100 can be referred to as having "2.5D integration" in that multiple microelectronic elements 111 are incorporated and electrically interconnected within the assembly 100 and the assembly has terminals 137 configured for connection with corresponding contacts 162 of a circuit panel 160, such as by surface mount connection. Thus, electrical interconnections among individual microelectronic elements 111 may extend entirely along electrically conductive elements of the assembly, that is, without requiring such signal paths to extend along electrical conductors of the circuit panel 160 external to the assembly. As such, the level of integration in the assembly is greater than the level of integration ("2D") provided by a traditional single die microelectronic package.

Assembly 100 comprises a circuit structure 120 made of a plurality of dielectric layers and electrically conductive features thereon such as bumps 125 at a first surface 121 of the circuit structure. A dielectric element 130 of the assembly has a set of contacts 132 at a first surface 131 which face and are joined with corresponding bumps 125 of the circuit structure. With the circuit structure being made of dielectric layers rather than semiconductor material, and omitting semiconductor material as a primary material supporting the electrically conductive features, advantages for cost of the circuit structure, simplified fabrication and other advantages can be obtained as described below. The dielectric element in some cases may have a thickness of 1 to 2 millimeters in a direction normal to the first surface 131. The dielectric material of the dielectric layers is a material which can be deposited and patterned to form structures which support metallization thereon at a pitch of less than 2 micrometers, less than 1 micrometer, at least as low as 0.2 micrometers. In particular examples, the dielectric material can be deposited by chemical vapor deposition ("CVD"), spray coating, spin coating, roller coating, dipping, or the like. In particular examples, the dielectric material can be a photosensitive polymer, e.g., benzocyclobutene ("BCB")-based material, or other photosensitive material. In one example, the circuit has a maximum thickness T of less than 10 micrometers in a direction normal to the first surface 121 of the circuit structure.

As further seen in FIG. 3, a plurality of circuit structure contacts 122 at a second surface 123 of the circuit structure 120 opposite the first surface 121 are electrically coupled with the bumps 125 through the electrically conductive features of the circuit structure which include traces 127. As used in this disclosure with reference to a dielectric element or other component, e.g., circuit structure, interposer, microelectronic element, capacitor, voltage regulator, circuit panel, substrate, etc., a statement that an electrically conductive element is "at" a surface of a component indicates that, when the component is not assembled with any other element, the electrically conductive element is available for contact with a theoretical point moving in a direction perpendicular to the surface of the component toward the surface of the component from outside the component. Thus, a terminal or other conductive element which is at a surface of a substrate may project from such surface; may be flush with such surface; or may be recessed relative to such surface in a hole or depression in the substrate.

In assembly 100 the traces on the circuit structure 120 may have their smallest pitch and their smallest line and space dimensions at positions which are closer to the second surface 123 of the circuit structure than the first surface 121. Thus, traces of the circuit structure 120 which are disposed closer to the first surface 121 of the circuit structure 120 may have maximum widths greater than maximum widths of the second traces which are disposed closer to the second surface 123 of the circuit structure.

The contacts 122 of the circuit structure are configured for flip-chip connection with a plurality of element contacts 117 at faces 116 of a plurality of microelectronic elements 111, 112 and 114 having faces 116 overlying different portions of an area of the second surface 123 of the circuit structure. Stated another way, the circuit structure contacts 122 are configured to be joined with the corresponding elements contacts 117, as through electrically conductive bumps 118, in a state in which the circuit structure contacts 122 of the assembly 100 are juxtaposed with, i.e., face the corresponding element contacts 117 of the microelectronic elements 111, 112 and 114. FIG. 3 illustrates a multi-chip package which includes assembly 100 with the microelectronic elements mounted to circuit structure 120, the bumps 118 providing electrical interconnection between the microelectronic elements and the assembly. The circuit structure 120 also typically provides chip-to-chip electrical interconnectivity, through the electrically conductive features thereon including traces 127, between the respective microelectronic elements 111, 112, 114 within the multi-chip package.

In one example, the bumps may comprise a bond material such as tin, indium, solder, or the like, and/or an electrically conductive composition which includes a metal component such as metal particles or flakes and a polymeric component. Alternatively, the bumps can comprise posts or pins, or stud bumps or bond via interconnects each formed of extruded wire, such bumps projecting to heights thereof from the surface 121, and are joined with contacts 132 of the dielectric element at such heights with a joining metal such as tin, indium, solder or the like, or through diffusion bonds, for example.

Dielectric element 130 may have a single-metal layer or multiple-metal layer structure. In a particular example, the supporting dielectric structure can be reinforced by glass or semiconductor particles, rods or other such structure embedded within the dielectric material, which can be of or include any or all of epoxies, thermosetting plastics or thermoplastics, polyimide, polycarbonate, polytetra-fluoroethylene ("PTFE"), polymethyl methacrylate ("PMMA"), low-K dielectric materials, e.g., porous dielectric materials, low glasses, ceramics, or other materials. In particular examples, the dielectric element 130 can be of FR-4 or BT resin construction.

Assembly 100 further includes an encapsulant region 180 which may contact peripheral edge surfaces 134 of the dielectric element. The encapsulant may also flow between the facing first surfaces 121 and 131 of the circuit structure and the dielectric element, reinforcing the connections therebetween through the bumps 125. Alternatively, a separate encapsulant 181 may surround individual bumps 125 and fill spaces between the first surface 121 of the circuit structure and the first surface 131 of the dielectric element 130. Such encapsulant can be an underfill material for mechanically reinforcing connections between the circuit structure and the dielectric element through the bumps 125.

The material of the encapsulant region most typically has a composition different from the composition of the dielectric layers of the circuit structure and the dielectric element. In particular embodiments, the encapsulant material is an overmold or potting compound. Such compound can provide stiffness to the assembly to withstand internal differential thermal expansion within the assembly 100, or between the assembly 100 and other elements such as the microelectronic elements 111, 112, and 114. The compound may in some cases provide protection from shorting and moisture and/or water resistance. As seen in FIG. 3, the encapsulant can define an edge surface 182 of the assembly 100 which is parallel to a peripheral edge surface 134 of the dielectric element 130.

As seen in FIG. 3, in one example, the microelectronic elements are spaced apart from one another in one or more directions parallel to the second surface 123 of the circuit structure, such that the faces of adjacent microelectronic elements 111, 112, 114 do not overlap and there is some space, which can be small, separating the closest edge surfaces 124 of adjacent microelectronic elements from one another.

However, in another example (not shown), one or more of the microelectronic elements having contact-bearing faces at a greater height from the circuit structure surface 123 than one or more others of the microelectronic elements may partially overlap the one or more other microelectronic elements. For example, the microelectronic elements can be arranged and interconnected with the circuit structure in a manner such as seen in commonly owned U.S. Pat. No. 8,952,516 to Zohni et al., the disclosure of which is incorporated by reference herein.

Figure 2:
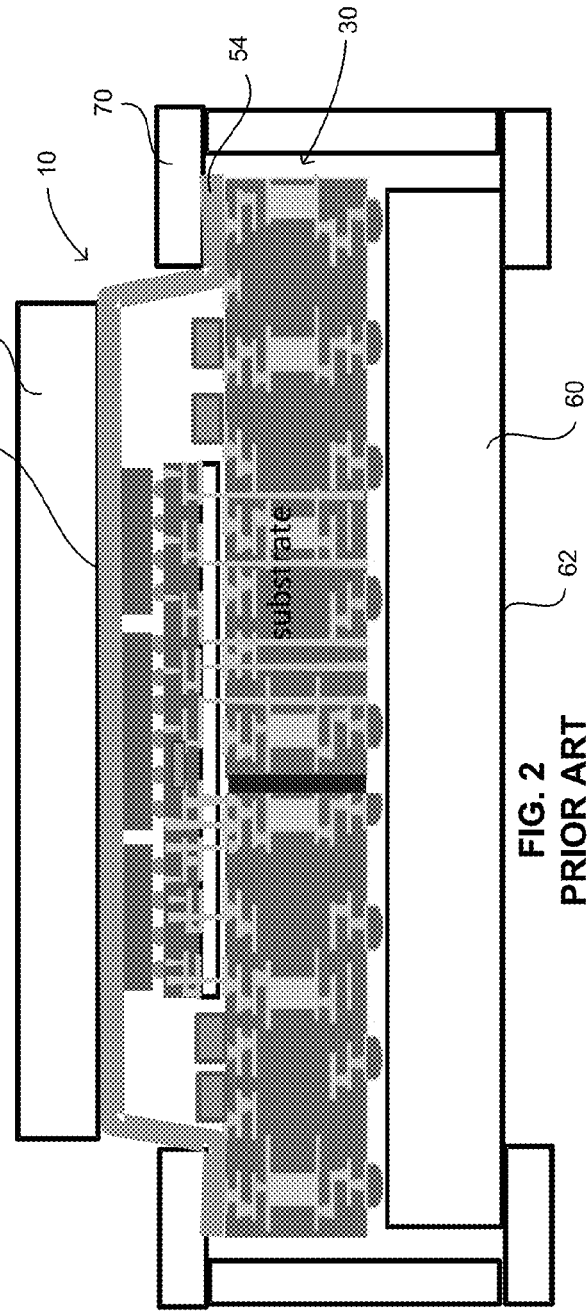
FIG. 2 depicts the multi-chip package of FIG. 1, as further electrically or mechanically interconnected with additional components.

As further seen in FIG. 3, a multi-chip package 110 may further include a heat spreader 150 which overlies and is thermally coupled with rear surfaces 152 of the microelectronic elements such as through a thermally conductive adhesive 154 or thermally conductive grease. The heat spreader 150 can include a foot portion 156 which provides a surface to which a clamp 170 (FIG. 4) can be applied, as described above relative to FIG. 2. As further seen in FIG. 4, the assembly can be electrically interconnected with contacts 164 at a surface of a circuit panel 160, such as through joining elements 162 attached to terminals 137 of the dielectric element at a surface 133 which faces oppositely from the surface 131 which faces the circuit structure 120. In one embodiment, the circuit panel 160 may extend beyond the dimension illustrated in FIG. 4 in one or more lateral directions 174, 176, 178, 179 which are parallel to a plane defined by the surface 161 of the circuit panel.

One or more electronic components 190, which may be passive components such as capacitors, resistors or inductors, or active components, can be provided in assembly 100. For example, as seen in FIG. 3, a plurality of such components 190 can be disposed underlying the first surface 121 of the circuit structure 120. The components 190 can be embedded in an encapsulant material 180 which occupies a volume of the assembly 100 below the surface 121 of the circuit structure 120 and beyond the peripheral edges 134 of the dielectric element 130. This differs from electronic components 40 of the assembly 10 (FIG. 1) described in the foregoing. In that assembly 10, components 40 are disposed only beyond peripheral edges 22 of the silicon interposer. In addition, because the foot portion 156 of heat spreader 150 of multi-chip package 110 is adjacent surface 123 of the circuit structure rather than a substrate 30 as seen in the above-described assembly (FIG. 1), the one or more electronic components 190 can be disposed within any part of the volume that underlies either the surface 121 of the circuit structure, the heat spreader 150, or both.

In one example, a plurality of electronic components 190 can be disposed just below surface 121 of the circuit structure and embedded within the encapsulant 180. In some cases, each electronic component can be disposed beyond a peripheral edge 134 of the dielectric element such that it lies outside the area aligned with the surface 131 of the dielectric element. In this way, one or more relatively large components such as a voltage regulator 192 (FIG. 3) can be disposed beyond one or more peripheral edges 134 of the dielectric element as embedded within encapsulant 180. It is also seen that a peripheral portion 128 of the circuit structure can be disposed between an edge surface 124 which defines a boundary of an area a microelectronic element such that the peripheral portion extends between such edge and a peripheral edge 182 of the assembly.

Figure 5:
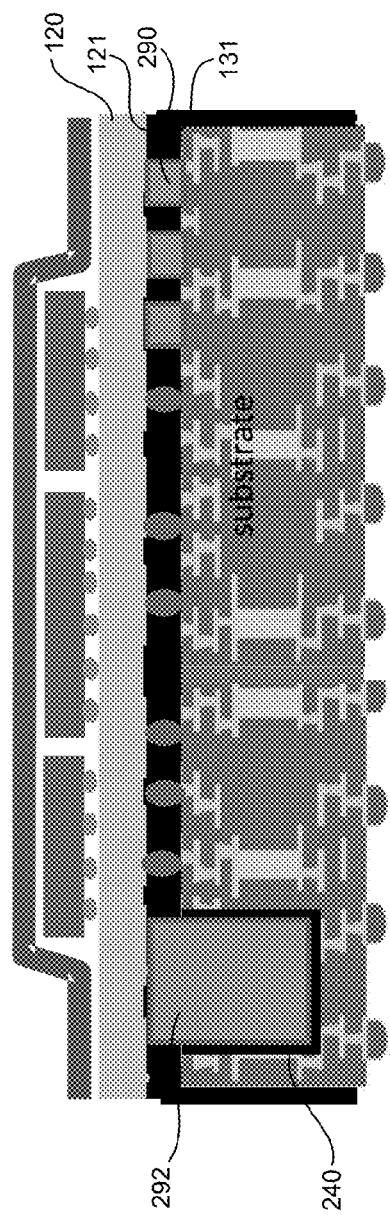
FIG. 5 depicts a multi-chip package in accordance with a variation of the embodiment seen in FIG. 3.
Figure 6:
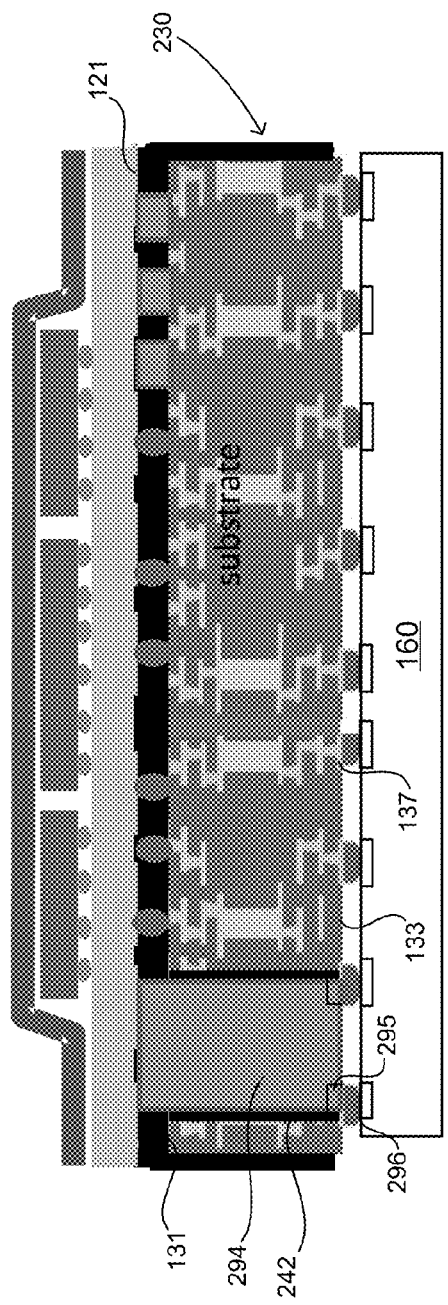
FIG. 6 depicts a multi-chip package in accordance with a variation of the embodiment seen in FIG. 3.

Alternatively, as seen in FIG. 5, one or more electronic components 290 can be disposed between a first surface 121 of the circuit structure and a first surface 131 of the dielectric element which faces the first surface 121 of the circuit structure. Another way is for an electronic component 292 to be disposed at least partially within a recess 240 of the dielectric element extending in a direction below the first surface 131 of the dielectric element. The component 292 may extend from a position adjacent the first surface 121 of the circuit structure where electrical interconnection can be provided between component 292 and circuit structure 120, but component 292 may not be disposed as close to the surface 121 in all cases. In a further example seen in FIG. 6, a through hole 242 can be provided extending through the dielectric element 2130 from first surface 131 to a second surface 133 opposite thereto. The electronic component 294 can extend from a position adjacent the first surface 121 of the circuit structure where it may be electrically interconnected with the circuit structure. Terminals 295, with optionally a plurality of joining elements 296 thereon, can be provided at a surface of the component 294 opposite that which is adjacent to the circuit structure, for joining the electronic component with a corresponding element such as circuit panel disposed below the dielectric element 230 and component 294, i.e., similar to the configuration seen in FIG. 4.

FIG. 7A illustrates a variation of the embodiment (FIG. 4) described above in which encapsulant provided on the first surface 121 of the circuit structure forms a fillet 184 extending between such first surface 121 and a peripheral edge surface 134 of the dielectric element. For example, the encapsulant 184 can be an underfill which fills a volume between the opposing first surfaces 121, 131 of the circuit structure and the dielectric element, respectively, and which can extend along the peripheral edge surface 134 of the dielectric element, wherein the thickness of the encapsulant on the edge surface 134 tapers off with a distance in a normal direction from the first surface 121 of the circuit structure. Such arrangement can result when a peripheral edge surface 126 of the circuit structure 120 extends beyond the adjacent corresponding edge surface 134 of the dielectric element such that the circuit structure 120 overhangs the dielectric element. Such arrangement can result when a peripheral edge surface 126 of the circuit structure 120 extends beyond the adjacent corresponding edge surface 134 of the dielectric element such that the circuit structure 120 overhangs the dielectric element.

Figure 7B:
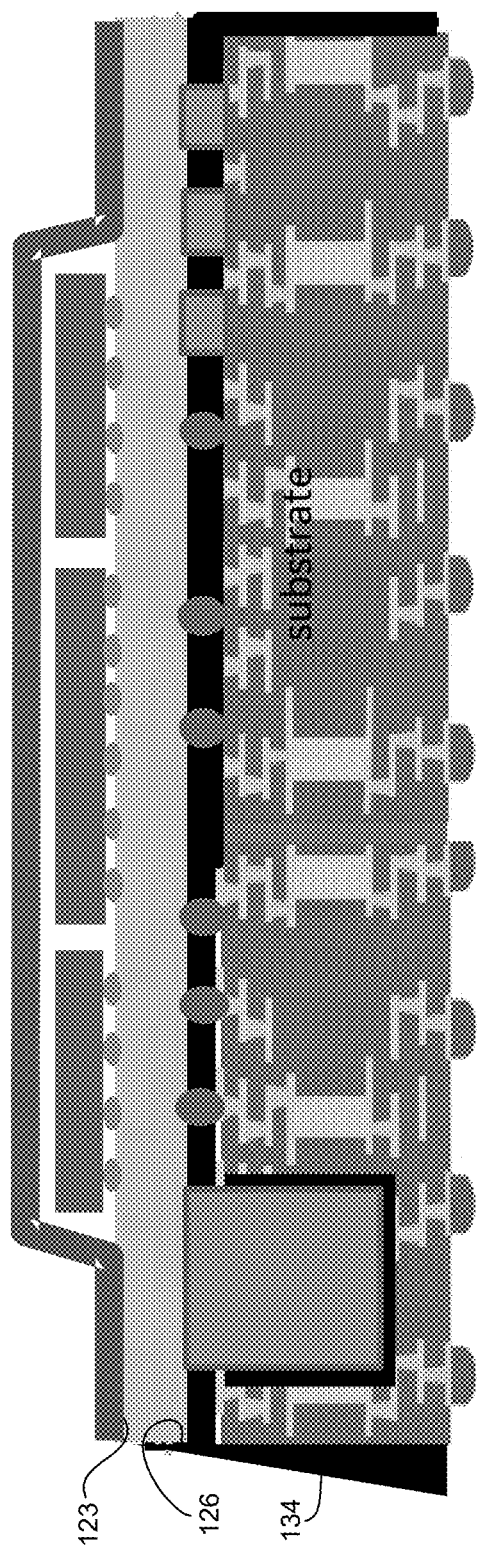
FIG. 7B depicts a multi-chip package in accordance with a variation of the embodiment seen in FIG. 3.

In another variation, as seen in FIG. 7B, the encapsulant 280 can taper down in thickness in a direction as the encapsulant extends towards the second surface 123 of the circuit structure. For example, the encapsulant may have a greater thickness in areas overlying the edge surface 134 of the dielectric element and tapers down in thickness on the edge surface 126 as the distance towards the second surface 123 of the circuit structure decreases. In a particular embodiment, although not shown specifically in FIG. 7B, the edge surface 134 of the dielectric element can be disposed beyond a corresponding edge surface 226 of the circuit structure in a direction parallel to the second surface 123.

In a variation of the above-described embodiment, seen in FIG. 8, portions of the encapsulant 280 and the heat spreader 250 can extend beyond the peripheral edge surface 226 of the circuit structure in a direction parallel to second surface 123 of the circuit structure. Specifically, a foot portion 256 of the heat spreader can extend beyond the edge surface 226 of the circuit structure. In such case, encapsulant region 280 may extend beyond the edge surface 226 and may be thermally coupled with or may contact a downwardly-facing surface 253 of the foot portion 256 of the heat spreader which extends beyond the edge surface 226.

As also seen in FIG. 8, a component 298 such as a passive or active component, or in a particular example, a voltage regulator, can be disposed within, e.g., embedded within an encapsulant region 280 of the assembly which lies beyond a peripheral edge surface 134 of the dielectric element.

Figure 9:
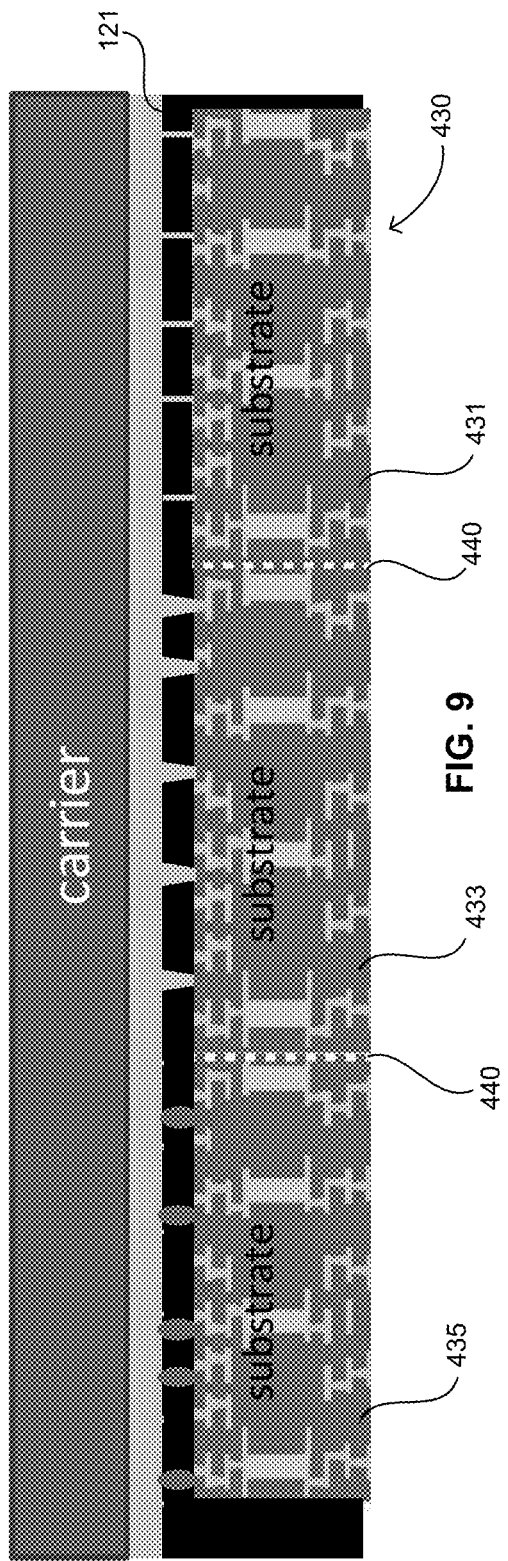
FIG. 9 depicts a multi-chip package in accordance with a variation of the embodiment seen in FIG. 3.

In one variation of the above-described embodiment, as seen in FIG. 9, an assembly used in a multi-chip package may include a dielectric element 430 which comprises a plurality of first regions 431, 433 and 435, each of which includes one or more dielectric layers, as well as electrically conductive traces and contacts thereon. Adjacent first regions of the dielectric element 430 can be mechanically connected in one or more lateral directions by partially perforated regions 440. As seen in FIG. 9, the partially perforated regions extend in a direction normal to the first surface 121 of the circuit structure. Perforated regions can be advantageously utilized in formation of the encapsulant region between the dielectric element and the first surface 121 of the circuit structure. Alternatively, or in addition thereto, the perforated regions 440 can help promote the mechanical integrity of the assembly when the dielectric element has a large area in directions parallel to the first surface 121, since the perforated regions effectively reduce the dimensions of the dielectric element which are subject to differential thermal expansion relative to the microelectronic elements to be united with the assembly.

Figure 13:
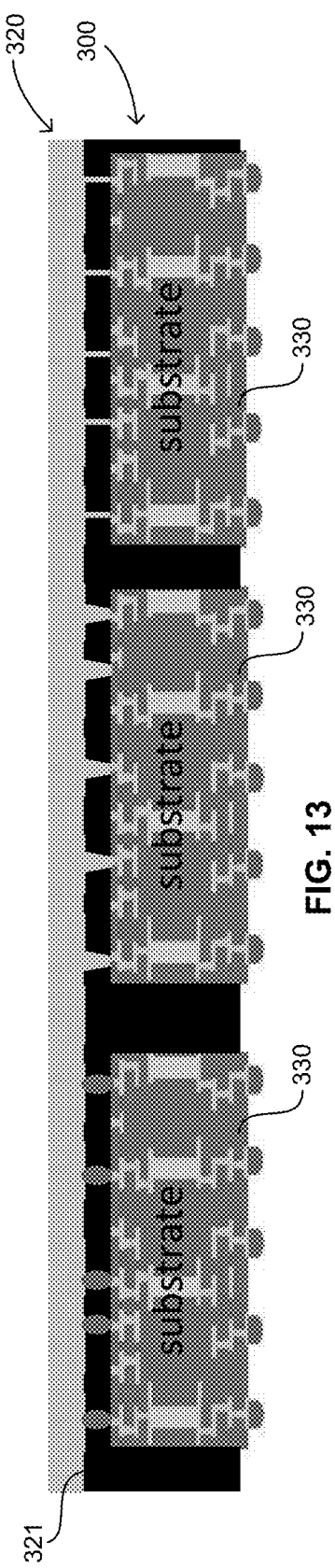
FIG. 13 depicts a multi-chip package in accordance with a variation of the embodiment seen in FIG. 3.

In another variation of the above-described embodiment, as seen in FIG. 13, an assembly 300 used in a multi-chip package may include a plurality of discrete dielectric elements 330 for which a common circuit structure 320 is provided and to which the dielectric elements are electrically coupled. In such case, encapsulant 380 can extend between adjacent edge surfaces 334 of the dielectric elements, binding the dielectric elements and the common circuit structure together in one integral assembly 300. Such assembly 300 can then be electrically interconnected with the microelectronic elements to form a multi-chip package similar to that described relative to FIG. 3 above, except that the assembly includes a plurality of individual dielectric elements which are spaced apart from one another in a direction parallel to a surface 321 of the circuit structure 320.

A method of fabrication will now be described in accordance with FIGS. 10 through 12. Referring to FIG. 10, the circuit structure 520 can be fabricated by depositing a dielectric layer and electrically conductive features such as contacts and traces over a surface of a carrier 510 on which a release layer may be provided. The carrier typically is a flat plate-like element of ceramic, glass, or semiconductor composition, or in some cases, an overmold material. The carrier may have a coefficient of thermal expansion of less than 12 parts per million per degree Celsius ("ppm/° C."). The process can be performed so as to form a plurality of dielectric layers and electrically conductive features such as described above with reference to FIG. 3. Typically, features, e.g., traces having finest pitch or finest line and space widths, are formed first and closest to a surface of the carrier, after which traces having pitch or line and space widths larger than the finest pitch and line/space widths are formed. Then, bumps 525, e.g., masses of bonding material, cylindrical or frusto-conical posts or pins, stud bumps, bumps of extruded wire, or the like, can be formed extending from a surface 521 of the circuit structure 520.

Next, dielectric elements 130 having one or more dielectric layers and having electrically conductive features such as traces and contacts thereon, are united with the circuit structure such that the bumps 525 are joined with corresponding contacts (not shown) of the dielectric element as seen in FIG. 11. An encapsulant 180 can then be introduced into spaces below the first surface 521 of the circuit structure, the encapsulant 180 filling spaces between adjacent edge surfaces 534 of the dielectric elements. Either a separate underfill, or optionally, the same encapsulant material 180, can be applied to the space surrounding bumps 525 between the circuit structure and the dielectric elements.

Figure 12:
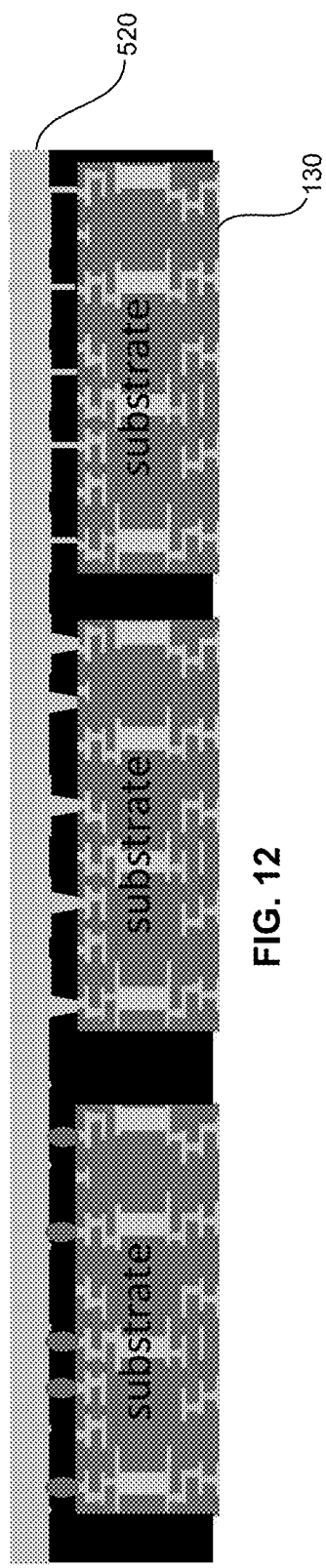
FIG. 12 depicts a further stage in a method of making a multi-chip package in accordance with an embodiment disclosed herein.

Referring to FIG. 12, after forming the encapsulation on the assembly of the circuit structure and the dielectric elements, the carrier can then be separated therefrom. The circuit structure 520 may at this stage of processing be an in-process circuit structure having dimensions greater than the dimensions of an individual circuit structure 120 seen in FIG. 3. Thereafter, joining elements can be applied to contacts on the dielectric elements of the in-process structure. In time, microelectronic elements can be united with the contacts of the circuit structure. Either before or after assembly of the microelectronic elements thereon, the in-process structure can be severed into individual assemblies, each as seen, for example, in FIG. 3.

In particular embodiments, the carrier can be separated from the in-process structure by mechanical or chemically assisted dissolution of a release layer disposed therebetween. Alternatively, the carrier can be abraded from a side opposite the in-process structure until the in-process structure is released therefrom.

Figure 14:
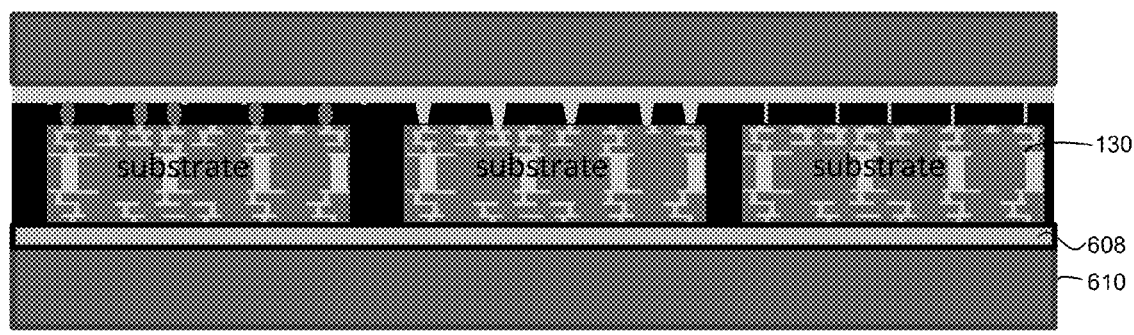
FIG. 14 depicts a stage in a method of making a multi-chip package in accordance with an embodiment disclosed herein.
Figure 15:
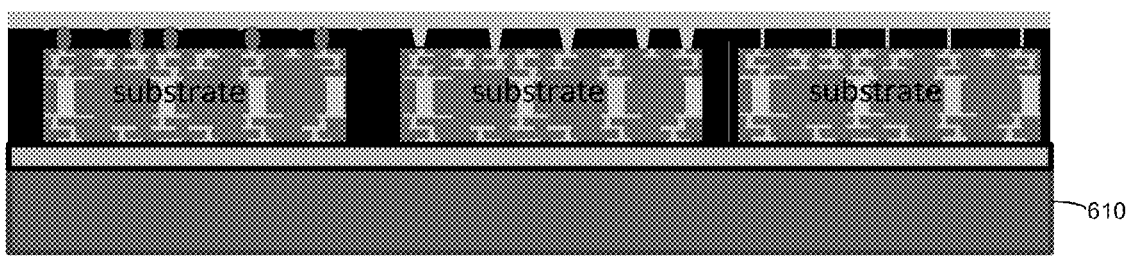
FIG. 15 depicts a stage in a method of making a multi-chip package in accordance with an embodiment disclosed herein.
Figure 16:
FIG. 16 depicts a stage in a method of making a multi-chip package in accordance with an embodiment disclosed herein.

Referring now to FIGS. 14, 15 and 16, in a variation of the method of fabrication described above relative to FIGS. 10-12, a second carrier 610 can be attached below lower surfaces of the dielectric elements 130, such as through a second releasable layer 608 provided between the dielectric elements and the second carrier 610. The second carrier can be used to support the assembly during removal of the first carrier therefrom, as seen in FIG. 15.

As further seen in FIG. 16, the second carrier can then be removed after removal of the first carrier, resulting in a structure as shown therein, after which microelectronic elements are attached and electrically coupled with conductive elements at a surface 523 of the circuit structure which faces the microelectronic elements. Thereafter, the assembly of the circuit structure and dielectric elements can then be severed into individual microelectronic assemblies, each including at least one dielectric element 130 and a plurality of microelectronic elements attached thereto and having at least some electrical interconnections through the circuit structure.

In still another variation, microelectronic elements can be assembled with the in-process structure seen in FIG. 15 before the second carrier 610 is separated from the assembly. In yet another variation, microelectronic elements can be assembled with a subassembly which includes a severed portion of the circuit structure 520 seen in FIG. 16 and includes at least one dielectric element 130, which provides a microelectronic assembly such as described above relative to FIG. 3.

Figure 17:
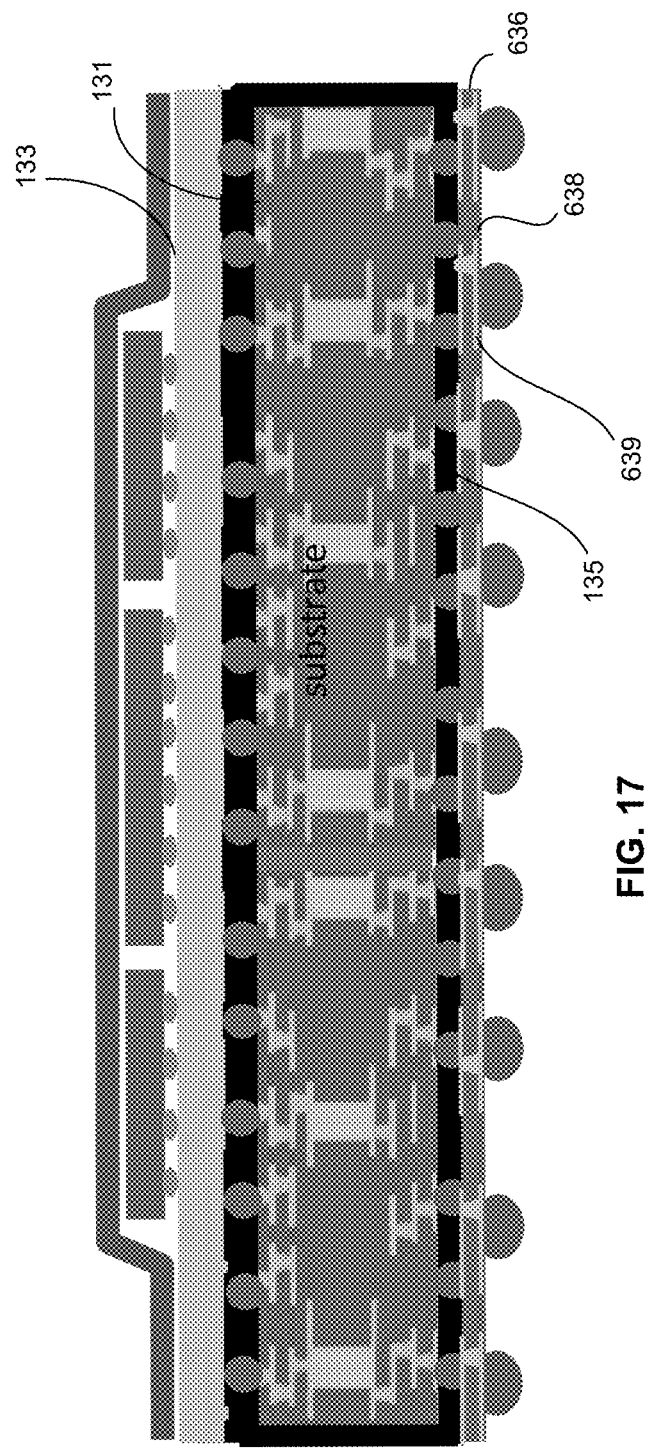
FIG. 17 depicts a multi-chip package in accordance with a variation of the embodiment seen in FIG. 3.

FIG. 17 further illustrates balancing which can be provided on the assembly, such as for a purpose of reducing or avoiding warpage. Specifically, a redistribution structure 636 which includes one or more dielectric layers 638 and electrically conductive structure 639 thereon can be formed or otherwise provided overlying a surface 135 of the dielectric element opposite from the surface 131. Such balancing structure can help preserve the assembly flat at the exterior surface at which joining elements 650 are provided, and at the second surface 133 of the circuit structure, despite fluctuations in temperature during operation or storage which would increase warpage.

Figure 18:
FIG. 18 depicts a stage in a method of making a multi-chip package in accordance with an embodiment disclosed herein.

Referring now to FIGS. 18-21, stages are illustrated in a method of fabricating a microelectronic assembly 710 in accordance with a variation of the embodiment described above relative to FIGS. 10-12. As seen in FIG. 18, similar to the method described above relative to FIG. 10, a circuit structure 720 is formed atop a surface of a carrier 510. However, in this case, coarser (larger) patterned electrically conductive elements are disposed at or adjacent a surface 721 of the circuit structure which faces towards the carrier, and more finely patterned (smaller) electrically conductive elements are disposed at or adjacent a surface 723 of the circuit structure which faces away from the carrier.

Figure 19:
FIG. 19 depicts a further stage in a method of making a multi-chip package in accordance with an embodiment disclosed herein.

As further seen in FIG. 19, a plurality of microelectronic elements 111, 112 and 114 may now be attached and electrically interconnected with one another through the circuit structure 720. An encapsulant may further be provided between adjacent edge surfaces of the microelectronic elements, respectively to form the in-process assembly seen therein. In a particular embodiment, the encapsulant may be planarized to the top surfaces of the microelectronic elements 111, 112, 114.

Figure 20:
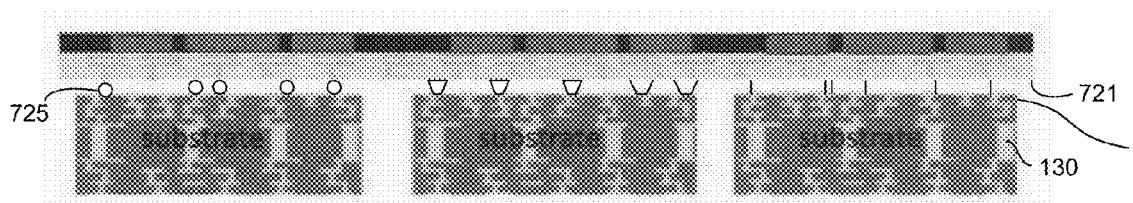
FIG. 20 depicts a further stage in a method of making a multi-chip package in accordance with an embodiment disclosed herein.

Thereafter, the circuit structure 710 with the microelectronic elements 111, 112, 114 mounted thereto and at least partially encapsulated within encapsulation 115, can be separated from the carrier and aligned with one or more dielectric elements 130, as further seen in FIG. 20. Electrical connection between the circuit structure and the dielectric element can be made through a plurality of bumps 725 which can be formed atop either one or both of the facing surfaces 131, 721 of the dielectric element and circuit structure, respectively.

Figure 21:
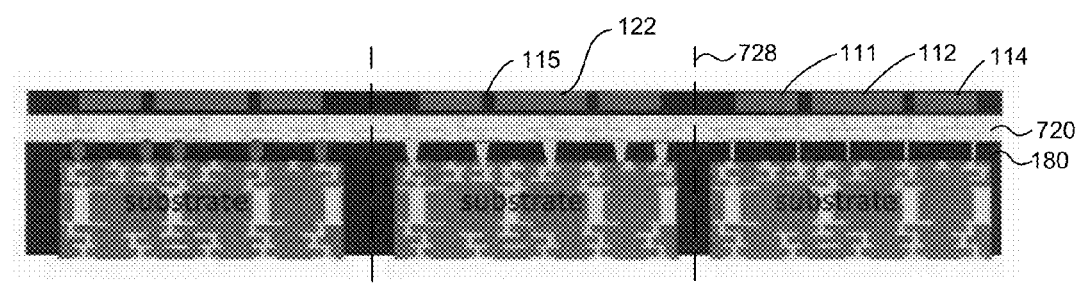
FIG. 21 depicts a further stage in a method of making a multi-chip package in accordance with an embodiment disclosed herein.

FIG. 21 illustrates a further stage of fabrication after an encapsulation has been formed similar to the encapsulation described above relative to FIG. 3. The structure may then be further processed by severing the encapsulations and circuit structure 720 along saw lanes 728 into individual microelectronic assemblies. The resulting microelectronic assemblies may have a plurality of microelectronic elements 111, 112, 114 which are at least partially encapsulated, with the encapsulation extending between adjacent edges 724 of the microelectronic elements. In one embodiment, surfaces 122 of the microelectronic elements which face away from the circuit structure may lie in a common plane so as to enable good thermal coupling with a thermal conduction element external to the microelectronic assembly.

It will be appreciated that the resulting microelectronic assembly can include additional components such as seen in any of FIGS. 3, 5-8 and 14. Each microelectronic assembly may be configured to be clamped with a heat spreader element to a circuit board in a manner similar to that shown in FIG. 4.

Figure 22:
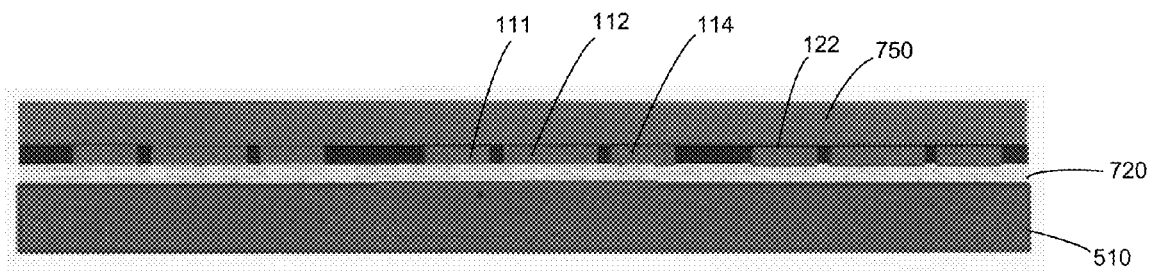
FIG. 22 depicts a stage in a method of making a multi-chip package in accordance with an embodiment disclosed herein.

Referring now to FIGS. 22-25, a method of fabricating microelectronic assemblies is provided in accordance with a variation of the method seen in FIGS. 18-21. As seen in FIG. 22, for example, a thermal conductor 750 which in some examples may be a metal sheet, illustratively of copper or copper alloy, is combined with the in-process assembly in FIG. 19, such that the metal sheet is thermally coupled with surfaces 122 of the microelectronic elements 111, 112, 114 which face away from the circuit structure 720. A thermal lubricant or adhesive can be provided between the surfaces of the microelectronic elements and the thermal conductor.

Figure 23:
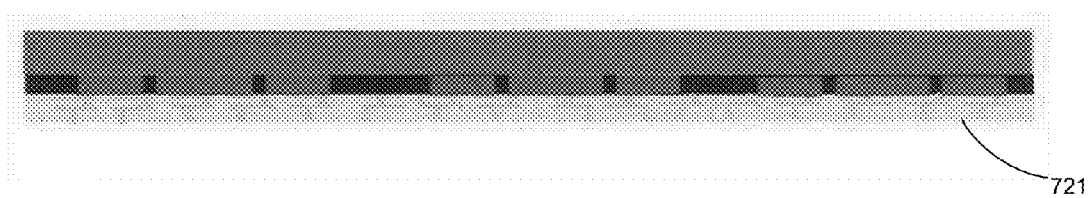
FIG. 23 depicts a further stage in a method of making a multi-chip package in accordance with an embodiment disclosed herein.
Figure 24:
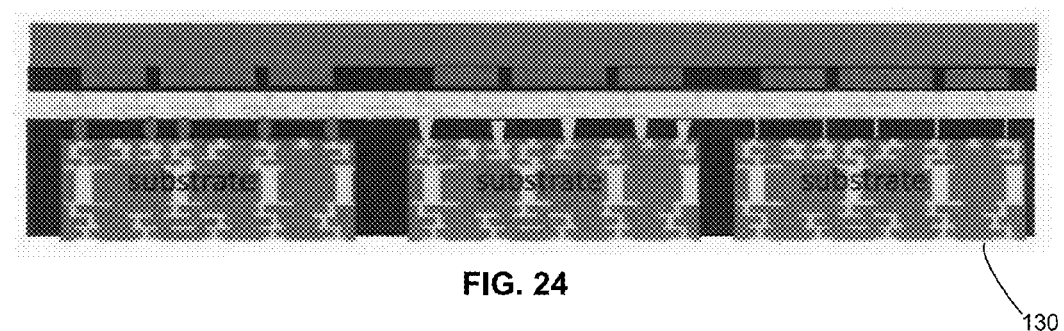
FIG. 24 depicts a further stage in a method of making a multi-chip package in accordance with an embodiment disclosed herein.
Figure 25:
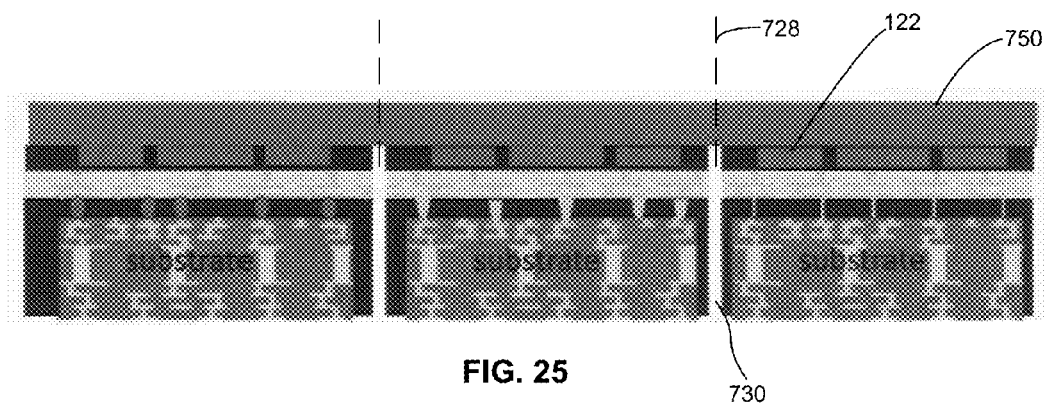
FIG. 25 depicts a further stage in a method of making a multi-chip package in accordance with an embodiment disclosed herein.

FIG. 23 illustrates a stage of processing after the carrier 510 seen in FIG. 22 is removed from overlying the surface 721 of the circuit structure. FIGS. 24 and 25 illustrate further processing by which the in-process structure of FIG. 23 is coupled with dielectric elements 130 and an encapsulation, and the resulting encapsulation then is severed to form channels 730, respectively. In further processing, the thermal conductor 750 can be severed along a set of saw lanes aligned with the channels to form individual microelectronic assemblies, each including a dielectric element, a circuit structure coupled thereto, and a plurality of encapsulated microelectronic elements at a surface of the circuit structure opposite facing away from the dielectric element, wherein the circuit structure electrically interconnects the microelectronic elements. Each microelectronic assembly includes an individual thermal conductor overlying and coupled to surfaces 122 of the microelectronic elements.

Figure 26:
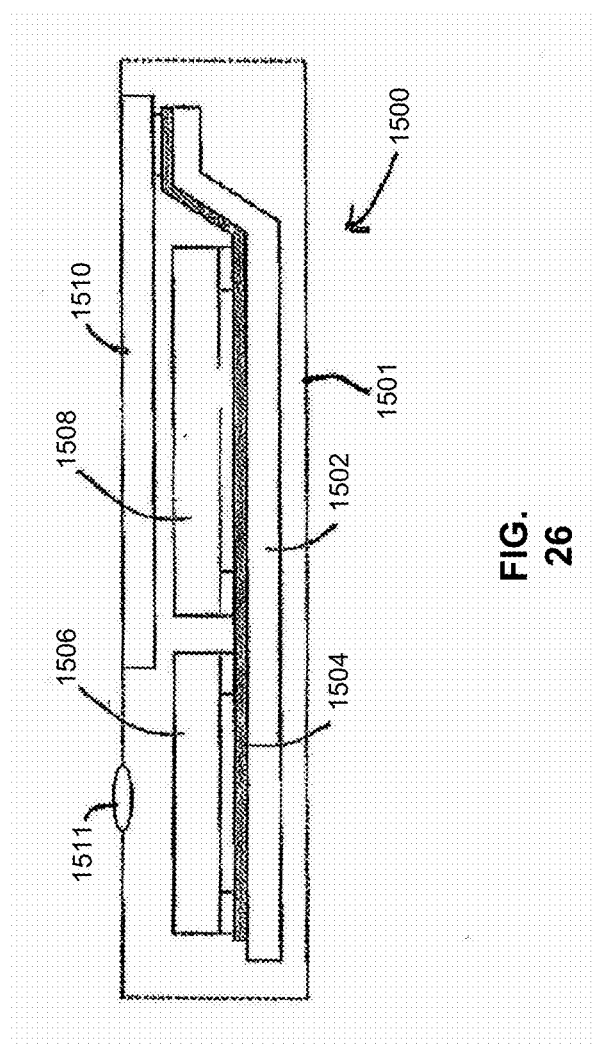
FIG. 26 depicts a system incorporating a multi-chip package in accordance with an embodiment disclosed herein.

The microelectronic packages and assemblies described above with reference to FIGS. 3 through 25 can be utilized in construction of diverse electronic systems, such as the system 1500 shown in FIG. 26. In specific examples and without limitation, a system may be a tablet, smartphone, other mobile device, or notebook or laptop computer or other type of processor-implemented device or computer. For example, the system 1500 in accordance with a further embodiment of the invention may include one or more microelectronic packages or assemblies as described above in conjunction with other electronic components 1508 and 1510.

In the exemplary system 1500 shown, the system can include a circuit panel, motherboard, or riser panel 1502 such as a flexible printed circuit board, and the circuit panel can include numerous conductors 1504, of which only one is depicted in FIG. 26, interconnecting the modules or components 1506 with one another. Such a circuit panel 1502 can transport signals to and from each of the microelectronic packages and/or microelectronic assemblies included in the system 1500. However, this is merely exemplary; any suitable structure for making electrical connections between the modules or components 1506 can be used.

In a particular embodiment, the system 1500 can also another component such as the semiconductor chip 1508 and component 1510 is a display screen, but any other components can be used in the system 1500. Of course, although only two additional components 1508 and 1510 are depicted in FIG. 26 for clarity of illustration, the system 1500 can include any number of such components.

Modules or components 1506 and components 1508 and 1510 can be mounted in a common housing 1501, schematically depicted in broken lines, and can be electrically interconnected with one another as necessary to form the desired circuit. The housing 1501 is depicted as a portable housing of the type usable, for example, in a smartphone or cellular telephone and screen 1510 can be exposed at the surface of the housing. In embodiments where a structure 1506 includes a light-sensitive element such as an imaging chip, a lens 1511 or other optical device also can be provided for routing light to the structure. Again, the simplified system shown in FIG. 26 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An assembly, comprising:
   a dielectric element having a plurality of contacts at a first surface thereof and a plurality of first electrically conductive traces coupled with the contacts, the first traces extending in directions parallel to the first surface;
   a circuit structure made of a plurality of dielectric layers and electrically conductive features thereon, the electrically conductive features comprising a plurality of bumps at a first surface of the circuit structure facing the contacts of the dielectric element and joined thereto, a plurality of circuit structure contacts at a second surface opposite the first surface, and a plurality of second traces, wherein the bumps and the circuit structure contacts are electrically coupled by the second traces, and the circuit structure contacts are configured for connection with a plurality of element contacts of each of a plurality of microelectronic elements in a state in which the circuit structure contacts are juxtaposed with the element contacts of each of the plurality of microelectronic elements, wherein the circuit structure has a maximum thickness of less than 10 micrometers in a direction normal to the first surface of the circuit structure; and
   at least one electronic component underlying the second surface of the circuit structure, wherein an electronic component of the at least one electronic component is disposed between the first surface of the dielectric element and the second surface of the circuit structure.

2. The assembly as claimed in claim 1, wherein the circuit structure contacts include first circuit structure contacts configured for connection with a first microelectronic element, and second circuit structure contacts configured for connection with a second microelectronic element spaced apart from the first microelectronic element in a direction parallel to the first surface of the circuit structure, wherein at least some of the first circuit structure contacts are electrically coupled with the second circuit structure contacts through the second traces.

3. The assembly as claimed in claim 1, further comprising an encapsulant contacting and underlying the first surface of the circuit structure.

4. The assembly as claimed in claim 1, wherein the bumps comprise extruded wire segments, the assembly further comprising a compliant underfill disposed between the first surface of the dielectric element and the second surface of the circuit structure, the underfill having a composition different from a composition of the dielectric element, and different from a composition of the circuit structure.

5. The assembly as claimed in claim 1, wherein at least some of the second traces are disposed closer to the first surface of the circuit structure and have maximum widths greater than maximum widths of the second traces which are disposed closer to the second surface of the circuit structure.

6. The assembly as claimed in claim 1, further comprising the plurality of microelectronic elements, wherein the circuit structure contacts are juxtaposed with and joined with the element contacts of the plurality of microelectronic elements.

7. The assembly as claimed in claim 1, further comprising the plurality of microelectronic elements, wherein the circuit structure contacts are juxtaposed with and joined with the element contacts of the plurality of microelectronic elements, and a peripheral portion of the circuit structure extends in a lateral direction between an edge of at least one of the microelectronic elements and an edge of the assembly, the peripheral portion overlying an electronic component of the at least one electronic component.

8. The assembly as claimed in claim 1, wherein another electronic component of the at least one electronic component extends below the first surface of the dielectric element.

9. The assembly as claimed in claim 1, wherein the at least one electronic component comprises at least one of a capacitor or a voltage regulator.

10. The assembly as claimed in claim 1, further comprising an encapsulant extending between the second surface of the circuit structure and an edge surface of the dielectric element.

11. The assembly as claimed in claim 1, further comprising an encapsulant extending between the first surface of the dielectric element and an edge surface of the circuit structure, wherein the encapsulant forms a fillet which tapers in thickness overlying the edge surface of the circuit structure in a direction normal to the second surface of the circuit structure.

12. The assembly as claimed in claim 2, wherein at least one of: the bumps, or connections between the bumps and the contacts of the dielectric element comprises a bond material, the assembly further comprising an underfill mechanically reinforcing the connections between the bumps of the circuit structure and the contacts of the dielectric element, the underfill having a composition different from a composition of the dielectric element, and different from a composition of the circuit structure.

13. The assembly as claimed in claim 8, wherein the another electronic component extending below the first surface of the dielectric element is disposed beyond a peripheral edge surface of the dielectric element.

14. The assembly as claimed in claim 8, wherein the another electronic component extending below the first surface of the dielectric element is disposed in a recess in the dielectric element, the recess extending downwardly from the first surface of the dielectric element.

15. The assembly as claimed in claim 7, further comprising a heat spreader overlying surfaces of the plurality of microelectronic elements at a first height above the circuit structure, wherein a foot portion of the heat spreader overlies the peripheral portion of the circuit structure at a second height lower than the first height from the circuit structure.

16. The assembly as claimed in claim 15, wherein the foot portion of the heat spreader extends beyond a peripheral edge of the circuit structure.

17. The assembly as claimed in claim 16, further comprising an encapsulant contacting a peripheral edge surface of the circuit structure and a downwardly facing surface of the heat spreader disposed beyond the edge surface of the circuit structure.

18. The assembly as claimed in claim 10, wherein the encapsulant forms a fillet which tapers in thickness overlying the edge surface of the dielectric element in a direction normal to the first surface of the dielectric element.

19. The assembly as claimed in claim 10, wherein at least a portion of the encapsulant defines an edge surface of the assembly which is parallel to an edge surface of the dielectric element.

20. The assembly as claimed in claim 19, wherein the dielectric element is a plurality of discrete dielectric elements, and the encapsulant extends between adjacent edge surfaces of at least two adjacent dielectric elements in the assembly.

21. The assembly as claimed in claim 19, wherein the dielectric element has a plurality of discrete dielectric elements, the encapsulant extending between edge surfaces of adjacent dielectric elements in the assembly.

22. The assembly as claimed in claim 19, wherein the dielectric element comprises a plurality of first regions connected in at least one lateral direction by partially perforated regions, each partially perforated region extending in a direction normal to the first surface.

23. An assembly, comprising:
a dielectric element having a plurality of contacts at a first surface thereof and a plurality of first electrically conductive traces coupled with the contacts, the first traces extending in directions parallel to the first surface;
a circuit structure made of a plurality of dielectric layers and electrically conductive features thereon, the electrically conductive features comprising a plurality of bumps at a first surface of the circuit structure facing the contacts of the dielectric element and joined thereto, a plurality of circuit structure contacts at a second surface opposite the first surface, and a plurality of second traces, wherein the bumps and the circuit structure contacts are electrically coupled by the second traces, and the circuit structure contacts are configured for connection with a plurality of element contacts of each of a plurality of microelectronic elements in a state in which the circuit structure contacts are juxtaposed with the element contacts of each of the plurality of microelectronic elements, wherein the circuit structure has a maximum thickness of less than 10 micrometers in a direction normal to the first surface of the circuit structure; and
at least one electronic component underlying the second surface of the circuit structure, wherein an electronic component of the at least one electronic component extends below the first surface of the dielectric element and has a plurality of contacts at a surface of the electronic component opposite from a surface of the electronic component which faces the circuit structure, the contacts of the electronic component configured for connection with a second component disposed below the assembly.

24. The assembly as claimed in claim 23, wherein an electronic component of the at least one electronic component is disposed between the first surface of the dielectric element and the second surface of the circuit structure.

25. An assembly, comprising:
a dielectric element having a plurality of contacts at a first surface thereof and a plurality of first electrically conductive traces coupled with the contacts, the first traces extending in directions parallel to the first surface;
a circuit structure made of a plurality of dielectric layers and electrically conductive features thereon and having a maximum thickness of less than 10 micrometers in a direction normal to the first surface of the circuit structure, the electrically conductive features comprising a plurality of bumps at a first surface of the circuit structure facing the contacts of the dielectric element and joined thereto, a plurality of circuit structure contacts at a second surface opposite the first surface, and a plurality of second traces, wherein the bumps and the circuit structure contacts are electrically coupled by the second traces;
a plurality of microelectronic elements each having a front surface, edge surfaces extending away from the front surface, and element contacts at the front surface, the element contacts juxtaposed with and electrically coupled with the circuit structure contacts;
an insulating encapsulation overlying at least the edge surfaces of the microelectronic elements; and
at least one electronic component underlying the second surface of the circuit structure, wherein an electronic component of the at least one electronic component is disposed between the first surface of the dielectric element and the second surface of the circuit structure.

26. The assembly as claimed in claim 25, wherein a carrier provides support during formation of the plurality of dielectric layers of the circuit structure thereon and assembly of the microelectronic elements with the circuit structure, and the circuit structure is separated from the carrier prior to assembly with the dielectric element.

27. The assembly as claimed in claim 25, wherein a release layer maintains the circuit structure atop the carrier during formation of the plurality of dielectric layers, and the circuit structure is separated from the carrier prior to assembly with the dielectric element by releasing the release layer.

28. The assembly as claimed in claim 25, wherein the circuit structure is separated from the carrier prior to assembly with the dielectric element by abrading the carrier.

29. The assembly as claimed in claim 26, wherein at least some of the first circuit structure contacts are electrically coupled with the second circuit structure contacts through the second traces.

* * * * *